(12) United States Patent
Yew et al.

(10) Patent No.: US 8,847,369 B2
(45) Date of Patent: Sep. 30, 2014

(54) PACKAGING STRUCTURES AND METHODS FOR SEMICONDUCTOR DEVICES

(75) Inventors: Ming-Chih Yew, Hsin-Chu (TW); Wen-Yi Lin, New Taipei (TW); Jiun Yi Wu, Zhongli (TW); Po-Yao Lin, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/554,839

(22) Filed: Jul. 20, 2012

(65) Prior Publication Data

US 2014/0021594 A1    Jan. 23, 2014

(51) Int. Cl.
| | | |
|---|---|---|
| H01L 23/495 | (2006.01) | |
| H01L 23/48 | (2006.01) | |
| H01L 23/52 | (2006.01) | |
| H01L 29/40 | (2006.01) | |
| H01L 21/44 | (2006.01) | |
| H05K 1/11 | (2006.01) | |
| H05K 3/02 | (2006.01) | |
| H05K 3/10 | (2006.01) | |

(52) U.S. Cl.
USPC .......... 257/669; 257/778; 257/E23.031; 438/612; 174/261; 29/846

(58) Field of Classification Search
USPC .......... 257/669, 778, E23.031; 438/612; 174/261; 29/846
See application file for complete search history.

(56) References Cited

U.S. PATENT DOCUMENTS

| | | |
|---|---|---|
| 6,787,918 B1 | 9/2004 | Tsai et al. |
| 6,790,759 B1 * | 9/2004 | Wang et al. .............. 438/612 |
| 2007/0096336 A1 | 5/2007 | Lee et al. |
| 2012/0032337 A1 * | 2/2012 | Lu et al. .................. 257/773 |

* cited by examiner

*Primary Examiner* — David S Blum
(74) *Attorney, Agent, or Firm* — Slater and Matsil, L.L.P.

(57) ABSTRACT

Packaging structures and methods for semiconductor devices are disclosed. In one embodiment, a substrate for packaging a semiconductor device includes a core substrate, an insulating material disposed over the core substrate, and conductive lines disposed in the insulating material. Contact pads are disposed over the insulating material and the conductive lines. The contact pads are disposed in an integrated circuit mounting region of the core substrate. A solder mask define (SMD) material is disposed over the insulating material. Portions of the contact pads are exposed through openings in the SMD material. A stress-relief structure (SRS) is disposed in the SMD material proximate the contact pads. The SRS is disposed entirely in the integrated circuit mounting region of the core substrate.

20 Claims, 12 Drawing Sheets

PACKAGING STRUCTURES AND METHODS FOR SEMICONDUCTOR DEVICES

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Wafer level packaging and vertical stacking of integrated circuits such as Package on package (PoP) technology and 3D integrated circuits (3DICs) are becoming increasingly popular due to their ability to allow for denser integration of integrated circuits into smaller overall packages.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to substrates for packaging semiconductor devices. Novel packages for semiconductor devices will be described herein.

Figure 1:
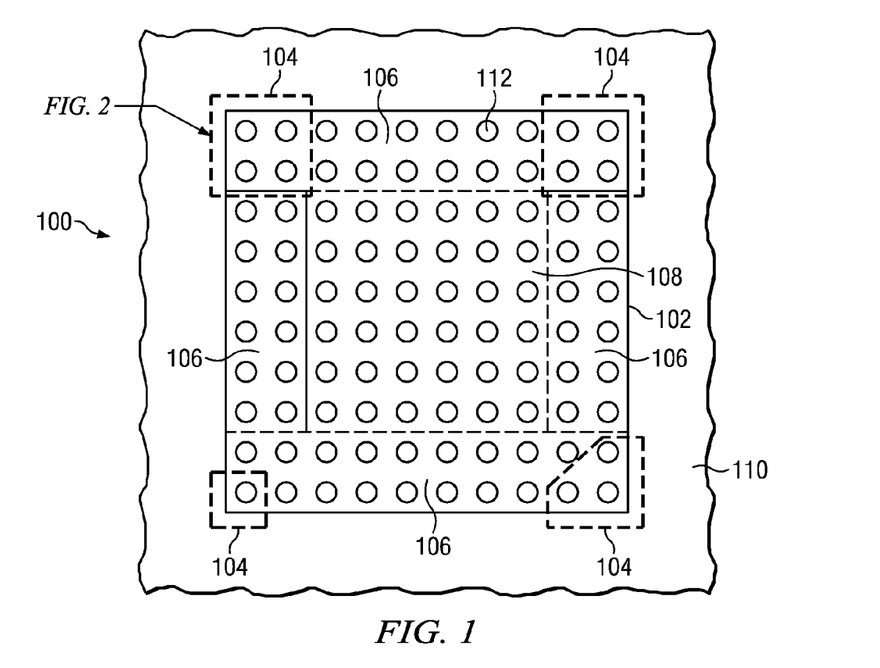
FIG. 1 shows a top view of a substrate for packaging a semiconductor device in accordance with an embodiment.

FIG. 1 shows a top view of a substrate 100 for packaging a semiconductor device in accordance with an embodiment. The substrate 100 is also referred to herein (e.g., in some of the claims) as a package 100. The substrate 100 includes an integrated circuit mounting region 102 where an integrated circuit die can be attached. The substrate 100 includes corner regions 104, edge regions 106, and a central region 108. A solder mask define (SMD) material 110 is formed over the substrate 100. Openings 112 are formed in the SMD material 110 over a plurality of contact pads 114/114a (not shown in FIG. 1; see FIGS. 2 and 3). The contact pads 114/114a are disposed over the top surface of the substrate 100 in an array of rows and columns in some embodiments. Alternatively, the contact pads 114 can be arranged in other shapes, such as random patterns or array patterns with portions of the array missing, depending on the integrated circuit contact layout.

In accordance with embodiments of the present disclosure, a stress-relief structure (SRS) 116 is formed in the SMD material 110 in stress-sensitive regions of the substrate 100. The stress-sensitive regions comprise corner regions or edge regions in some embodiments. The SRS 116 is formed in one or more corner regions 104 of the substrate 100 in some embodiments. The corner regions 104 may include one opening 112 or two or more openings 112. The SRS 116 is formed in one or more edge regions 106 of the substrate 100 in other embodiments. The edge regions 106 may include one row openings 112 or two or more rows of openings 112. Alternatively, the SRS 116 may be formed in other regions of the substrate 100 that are stress-sensitive in the central region 108, for example (not shown). The SRS 116 comprises a plurality of apertures 118 (see FIG. 2) formed in at least the SMD material 110, to be described further herein.

Figure 2:
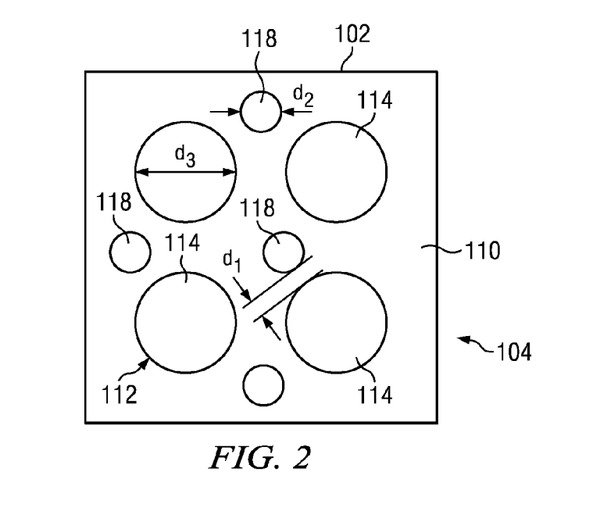
FIG. 2 is a more detailed view of a portion of the substrate shown in FIG. 1, illustrating a stress-relief structure (SRS) formed in a solder mask define (SMD) material of the substrate in accordance with an embodiment.

FIG. 2 is a more detailed view of a portion of the substrate 100 shown in FIG. 1 in a corner region 104, illustrating an SRS 116 formed in the SMD material 110 of the substrate 100 in accordance with an embodiment. The SRS 116 comprises a plurality of apertures 118 formed in the SMD material 110 proximate openings 112 in the SMD material 110 over the contact pads 114. The apertures 118 comprise a circular shape in the embodiment shown. The apertures 118 may alternatively comprise other shapes. Some of the apertures 118 are formed between two of the openings 112 in the SMD material 110 over the contact pads 114 in an embodiment. The apertures 118 of the SRS 116 are disposed proximate, yet not adjacent, the openings 112 for the contact pads 114.

The apertures 118 of the SRS 116 are spaced apart from edges of the openings 112 in the SMD material 110 over the contact pads 114 by a dimension $d_1$. Dimension $d_1$ comprises about 3 μm to 300 μm in an embodiment, although alternatively, dimension $d_1$ may comprise other values. The apertures 118 comprise a width comprising dimension $d_2$. Dimension $d_2$ comprises about 200 μm or less in an embodiment, although alternatively, dimension $d_2$ may comprise other values. The openings 112 over the contact pads 114 comprise a width comprising dimension $d_3$. Dimension $d_3$ comprises about 200 μm or less μm in an embodiment, although alternatively, dimension $d_3$ may comprise other values. In some embodiments, each of the plurality of apertures 118 has a width comprising dimension $d_2$ that is less than a width comprising dimension $d_3$ of the openings in the SMD material 110 over the plurality of contact pads 114. In other embodiments, dimension $d_2$ is substantially the same as dimension $d_3$. In other embodiments, dimension $d_2$ is greater than dimension $d_3$.

Figure 3:
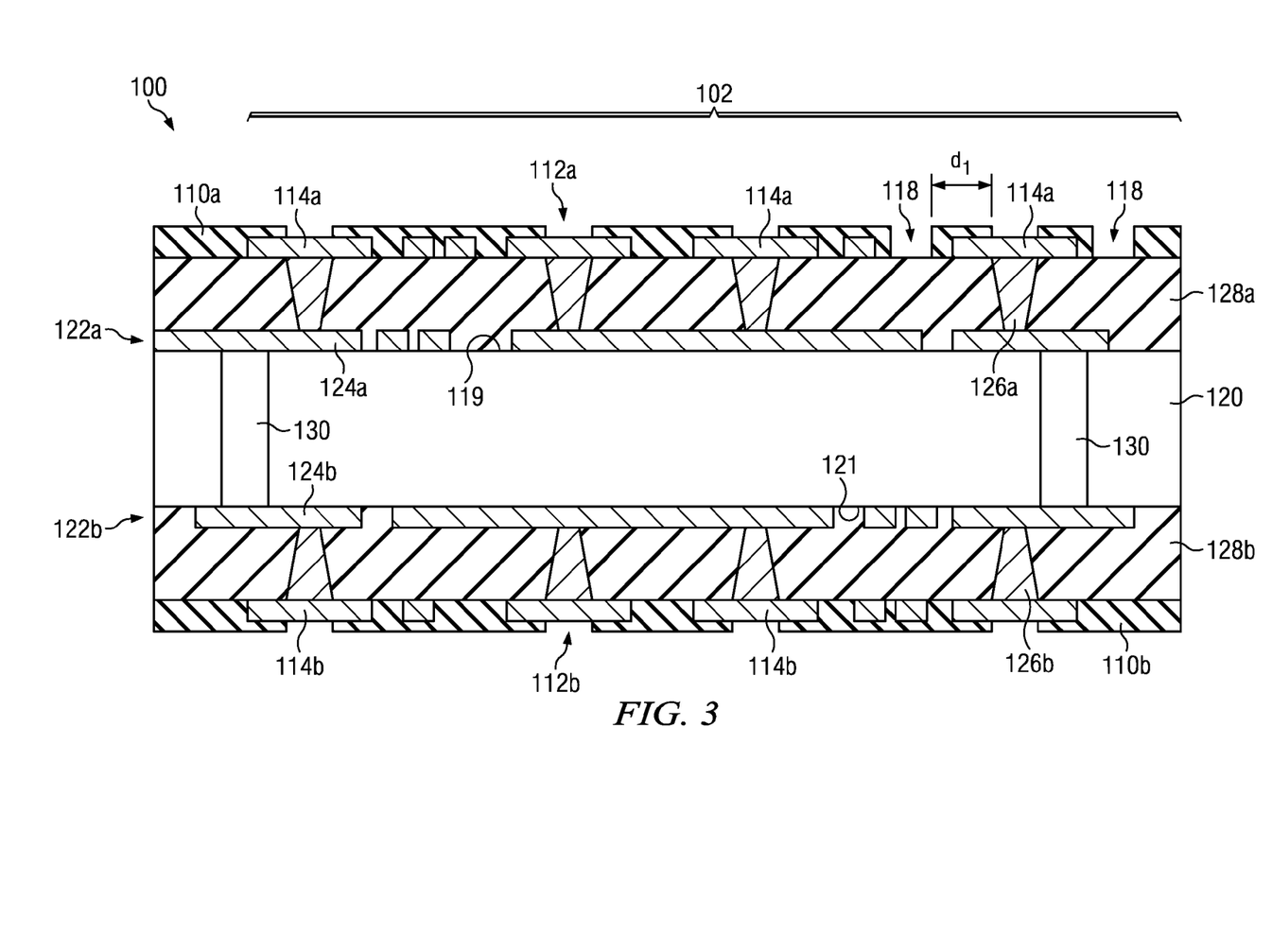
FIG. 3 is a cross-sectional view of a portion of the substrate shown in FIG. 1.

FIG. 3 is a cross-sectional view of a portion of the substrate 100 shown in FIG. 1. The substrate 100 is adapted to package a semiconductor device and comprises a core substrate 120. The core substrate 120 comprises Si, Ge, glass, an organic material, or other materials and may comprise a wafer form in the beginning of the manufacturing process for the package 100, for example. The core substrate 120 is later singulated to form a plurality of packaging substrates 100. The core substrate 120 includes a top surface 119 and a bottom surface 121 opposite the top surface 119.

An insulating material 128a is formed over the top surface 119 of the core substrate 120. The insulating material 128a is also referred to herein, e.g., in some of the claims, as a first insulating material 128a. The insulating material 128a comprises one or more layers of a dielectric material, such as silicon dioxide, silicon nitride, other dielectric materials, or combinations and multiple layers thereof, as examples. Alternatively, the insulating material 128a may comprise other materials.

A plurality of conductive lines 124a is disposed within the first insulating material 128a. The conductive lines 124a comprise a conductive material such as Cu, Al, other metals, or combinations and multiple layers thereof, as examples. Alternatively, the conductive lines 124 may comprise other materials. The conductive lines 124a may be forming using damascene or subtractive etch techniques, as examples.

A plurality of vias 126a are also disposed in the first insulating material 128a. At least some of the vias 126a are coupled to the conductive lines 124a. A plurality of contact pads 114a comprising first contact pads is disposed over the insulating material 128a, conductive lines 124a, and the vias 126a. The plurality of first contact pads 114a is disposed in an integrated circuit mounting region 102 of the core substrate 120. The first contact pads 114a comprise a conductive material such as Cu, Al, other metals, or combinations or multiple layers thereof, as examples. Alternatively, the first contact pads 114a may comprise other materials. The first contact pads 114a may be forming using damascene or subtractive etch techniques, as examples. Some of the first contact pads 114a may be coupled to vias 126a disposed within the first insulating material 128a. The first contact pads 114a, the vias 126a, and the first conductive lines 124a comprise a first redistribution layer (RDL) 122a in some embodiments, for example.

A solder mask define (SMD) material 110a is disposed over the first insulating material 128a and over the first contact pads 114a. The SMD material 110a comprises a non-conductive material such as epoxy, photoresist, polymer, or other insulating materials. The SMD material 110a comprises a first SMC material 110a in some embodiments. Portions of the plurality of contact pads 114a are exposed through openings in the SMD material 112a. Other portions, e.g., the edges of the contact pads 114a, are covered by the SMD material 110, as can be seen in the cross-sectional view of FIG. 3.

In accordance with embodiments of the present disclosure, a novel stress-relief structure (SRS) 116 is disposed in the first SMD material 110a proximate the plurality of contact pads 114a in stress-sensitive regions of the core substrate 120. The SRS 116 is disposed entirely in the integrated circuit mounting region 102 of the core substrate 120. The SRS 116 comprises a plurality of apertures 118 that are spaced apart from edges of the openings 112a by dimension $d_1$.

The package 110 for a semiconductor device also includes a second RDL 122b disposed over the bottom surface 121 of the core substrate 120 and a second insulating material 128b. The second RDL 122b includes a plurality of second conductive lines 124b, a plurality of vias 126b, and a plurality of second contact pads 114b formed in and over the second insulating material 128b. A second SMD material 110b is disposed over the second insulating material 128b, and portions of the plurality of second contact pads 114b are exposed through second openings 112b in the second SMD material 110b.

In some embodiments, the substrate 100 includes a core substrate 120 having a plurality of through-substrate vias (TSVs) 130 disposed therein. The TSVs 130 may comprise a semiconductive or conductive material, as examples. The TSVs 130 may alternatively comprise or include other materials. The TSVs 130 couple together portions of the first RDL 122a and the second RDL 122b and provide vertical interconnects for the substrate 100.

The first contact pads 114a are subsequently coupled to conductive bumps on an integrated circuit die in order to package the integrated circuit die, to be described further herein. Solder bumps are coupleable to the second contact pads 114b and may be used for mounting the packaged integrated circuit die in an end application, also to be described further herein.

Figures 4, 5:
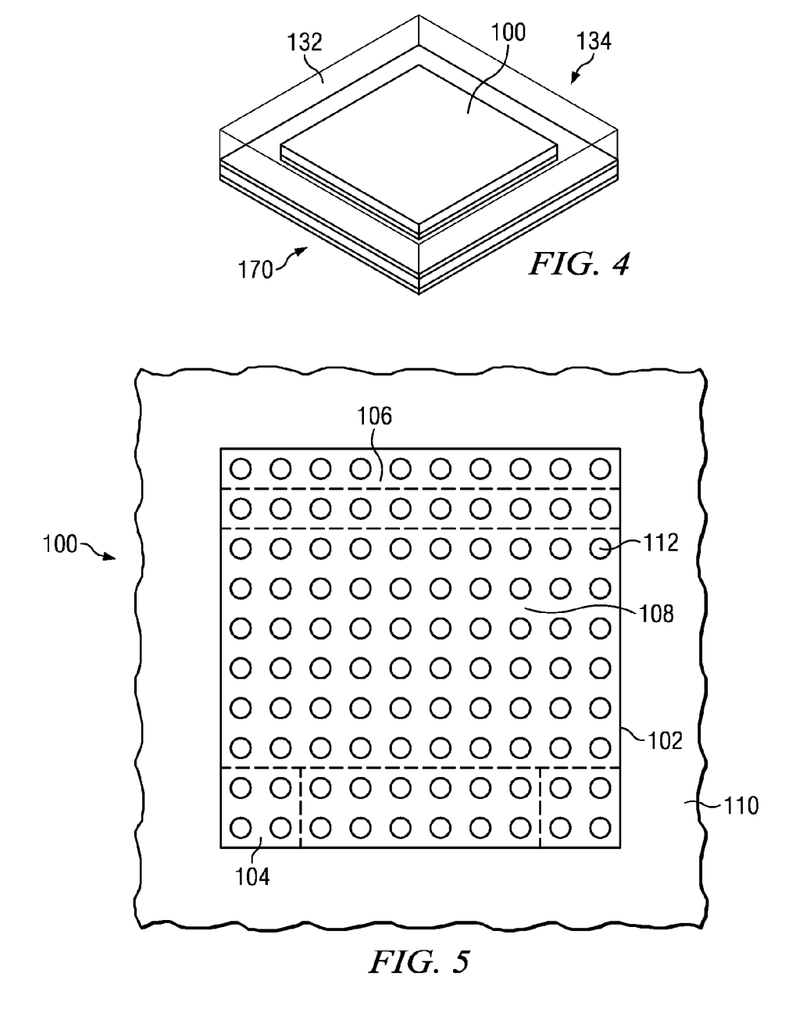
FIG. 4 is a perspective view of a packaged semiconductor device in accordance with an embodiment.
FIG. 5 is a top view of a packaging substrate that illustrates various regions of the substrate the SRS is formed in accordance with embodiments.

FIG. 4 is a perspective view of a packaged semiconductor device 170 in accordance with an embodiment of the present disclosure. The integrated circuit die 134 is placed on a top surface of the substrate 100, and a molding compound 132 is formed over the integrated circuit die 134 and the substrate 100, to be described further herein.

FIG. 5 is a top view of a packaging substrate 100 that illustrates various regions of the substrate 100 the SRS 116 is formed in accordance with embodiments. The SRS 116 may be formed in one or more corner regions 104 of the substrate 100. The SRS 116 may also, or may alternatively, be formed in one or more edge regions 106 of the substrate 100, in accordance with other embodiments.

Figure 6A:
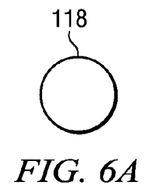
FIGS. 6A through 6E illustrate various shapes of apertures of the SRS in accordance with embodiments.
Figure 6B:
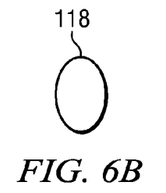
Figure 6C:
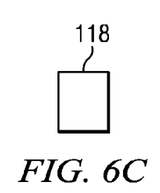
Figure 6D:
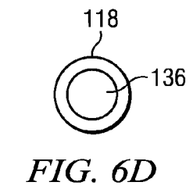
Figure 6E:
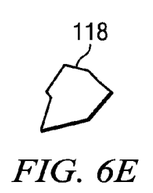

FIGS. 6A through 6E illustrate various shapes of apertures 118 of the SRS 116 in accordance with embodiments. The apertures 118 may be circular or round, as shown in FIG. 6A, or the apertures 118 may be oval, as shown in FIG. 6B. The apertures 118 may alternatively be square, as shown in FIG. 6C. In some embodiments, the apertures 118 are donut-shaped, as shown in FIG. 6D, comprising a ring shape that encloses a circular portion of the SMD material 110a. Alternatively, the apertures 118 may comprise an asymmetric shape, as shown in FIG. 6E. The shapes of the apertures 118 shown in FIGS. 6A through 6E are merely examples; alternatively, the apertures 118 may comprise other geometric shapes. The aperture 118 shapes may vary across the top surface 119 of the substrate 100; e.g., a plurality of differently shaped apertures 118 may be included in the SRS 116. The area A of each aperture 118 of the SRS 116 ranges from about 10 $\mu m^2$ to 10 $mm^2$ in some embodiments, as an example. Alternatively, the area A of the apertures 118 may comprise other values.

Figure 7:
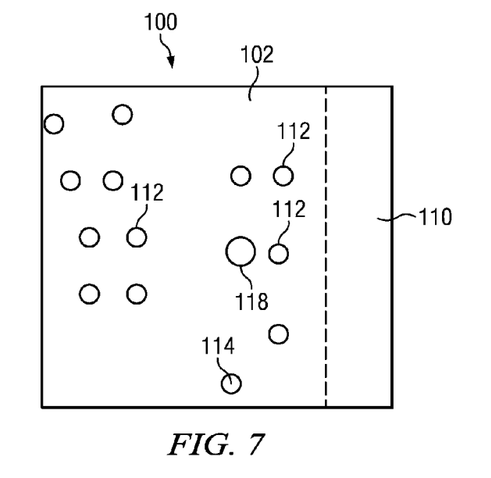
FIG. 7 is a more detailed view of a portion of a substrate that includes an SRS having a donut shape proximate openings for contact pads in accordance with an embodiment.

FIG. 7 is a more detailed view of a portion of a substrate 100 that includes an SRS 116 having a donut-shaped aperture 118 in the SMD material 110 proximate openings 112 for contact pads 114 in accordance with an embodiment. The aperture 118 relieves stress for a subsequently formed conductive bump that is attached to the contact pads 114. Only one aperture 118 is shown in FIG. 7; alternatively, a plurality of the apertures 118 may be formed in stress-sensitive regions of the substrate 100.

Figure 8A:
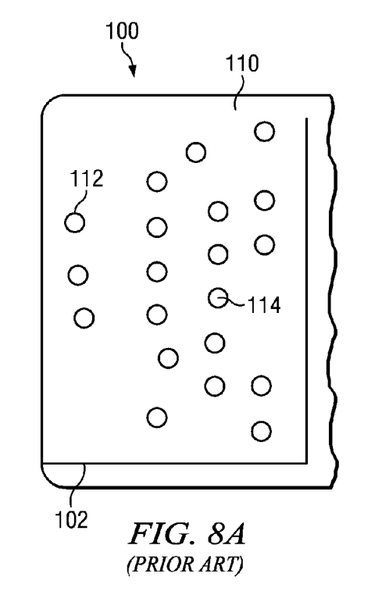
FIG. 8A shows a top view of a portion of a prior art packaging substrate.
Figure 8B:
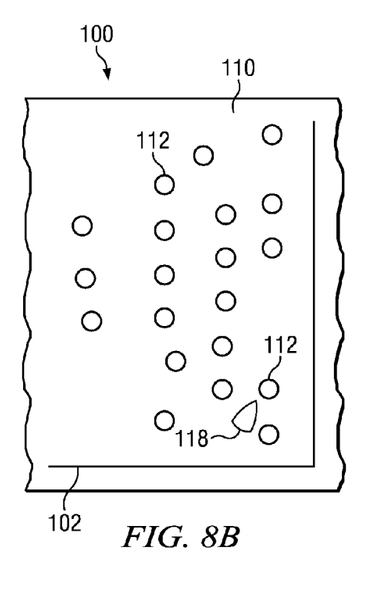
FIG. 8B is a top view of a portion of a packaging substrate in accordance with an embodiment that includes an SRS comprising an asymmetric-shaped aperture.
Figure 8C:
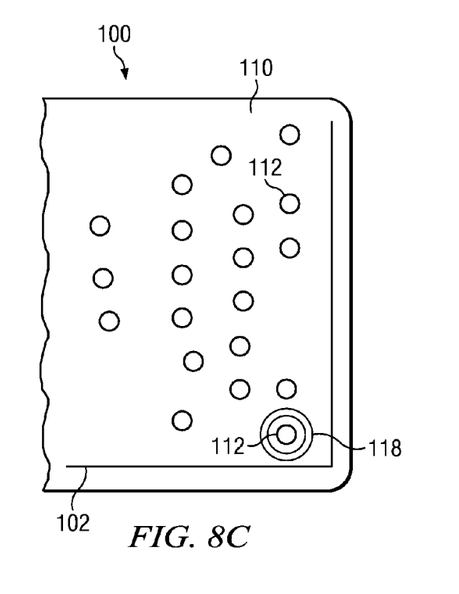
FIG. 8C is a top view of a portion of a packaging substrate in accordance with another embodiment that includes an SRS comprising a donut-shaped aperture disposed around an opening in the SMD material for a contact pad.

FIG. 8A shows a top view of a prior art packaging substrate 100. The openings 112 in the SMD material 110 over the contact pads 114 comprise a random pattern. FIG. 8B is a top view of a packaging substrate 100 in accordance with an embodiment of the present disclosure that includes an SRS 116 comprising an asymmetric-shaped aperture 118. The aperture 118 is positioned between three of the openings 112 for contact pads 114. FIG. 8C is a top view of a packaging substrate 100 in accordance with another embodiment that includes an SRS 116 comprising a donut-shaped aperture 118 disposed around an opening 112 in the SMD material over a contact pad 114.

Figure 9:
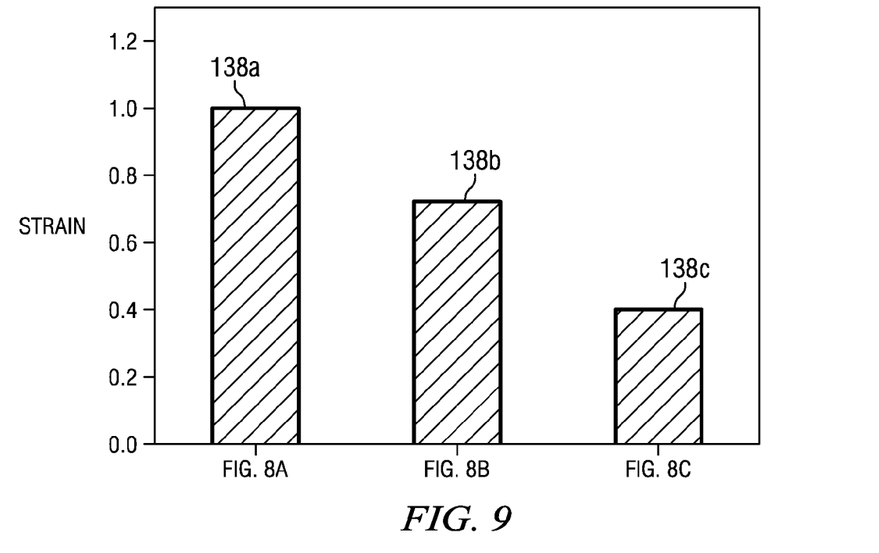
FIG. 9 is a chart comparing strain values of the packaging substrates shown in FIGS. 8A, 8B, and 8C.

FIG. 9 is a chart comparing strain values of the packaging substrates 100 shown in FIGS. 8A, 8B, and 8C obtained from modeling analysis. The strain value at corner bumps (e.g., bumps coupled to contact pads 114 in corners of the opening 112 array) was tested for each of the substrates 100. The strain values are normalized; e.g., the prior art packaging substrate 100 comprises a normalized strain value of 1.0 in corner regions of the substrate 100, shown at 138a. The packaging substrate 100 having the SRS 116 comprising an asymmetric-shaped aperture 118 shown in FIG. 8B was found to have a normalized strain value of 0.72 in the corner regions 104 of the substrate 100, shown at 138b. The packaging substrate 100 having the SRS 116 comprising a donut-shaped aperture 118 shown in FIG. 8C was found to have a normalized strain value of 0.41 in corner regions 104 of the substrate 100, shown at 138c. Thus, the novel SRSs 116 of the present disclosure decrease the strain by a significant amount, resulting in improved substrate 100 performance, thermal properties, and reliability.

Figure 10:
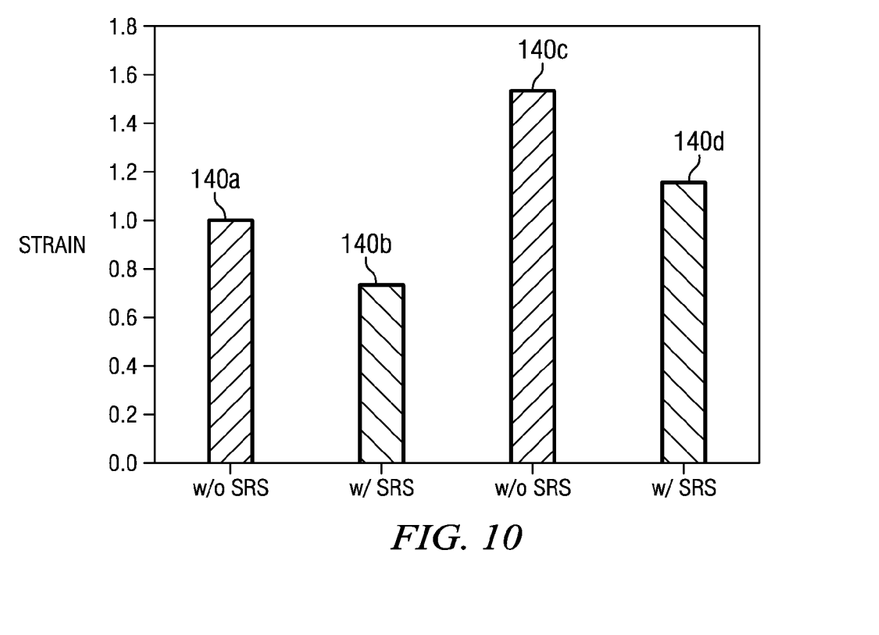
FIG. 10 is a chart comparing strain values for packaging substrates with and without the novel SRSs of the present disclosure.

FIG. 10 is a chart comparing strain values for packaging substrates 100 with and without the novel SRSs 116 of the present disclosure obtained from simulation analysis data. The effects of the SRS 116 related to integrated circuit die 134 thicknesses are shown. Normalized strain values at corner contact pads 114 for an integrated circuit die 134 having a thickness of about 150 $\mu m$ are shown at 140a and 140b. A strain value for a substrate 100 without an SRS 116 is shown at 140a, and a strain value for a substrate 100 with an SRS 116 comprising one or more circular apertures 118 is shown at 140b. The normalized strain value of the substrate 100 that includes the SRS 116 was found to be about 28% less than the strain value of the substrate 100 without the SRS 116. Normalized strain values at corner contact pads 114 for an integrated circuit die 134 having a thickness of about 600 $\mu m$ are shown at 140c and 140d. A strain value for a substrate 100 without an SRS 116 is shown at 140c, and a strain value for a substrate 100 with an SRS 116 comprising one or more circular apertures 118 is shown at 140d. The normalized strain value of the substrate 100 that includes the SRS 116 was found to be about 33% less than the strain of the substrate 100 without the SRS 116. Thus, the novel SRS 116 is effective in providing stress relief for the substrate 100 in critical regions such as the corners of the substrate 100.

Figure 11:
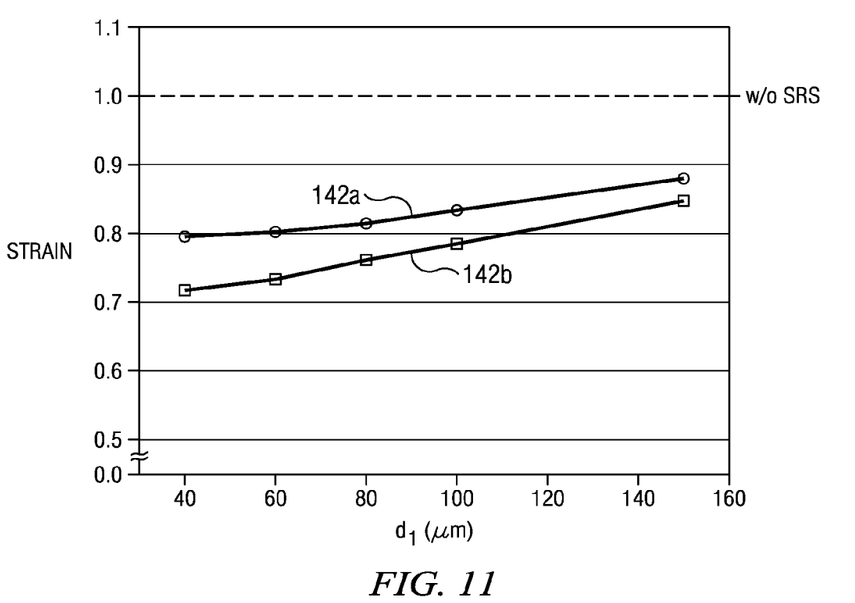
FIG. 11 is a graph comparing strain values for packaging substrates that include SRSs located at various distances away from edges of openings in the SMD material for contact pads.

FIG. 11 is a graph comparing strain values obtained from simulation analysis for packaging substrates for SRSs 116 with different distances comprising dimension $d_1$ from openings 112 in the SMD material 110 for contact pads 114. An original strain value for a substrate not including an SRS 116 described herein was 1.0 in the normalized graph. Normalized strain values for a substrate 100 that includes SRSs 116 having circular-shaped apertures 118 with a width comprising dimension $d_2$ of about 128 $\mu m$ and that are spaced apart from an edge of an opening 112 in the SMD material 110 over a corner contact pad 114 by a range of about 40 to 150 $\mu m$ (e.g., wherein dimension $d_1$ ranges from about 40 to 150 $\mu m$) is shown at 142a. Normalized strain values for a substrate 100 that includes SRSs 116 having circular-shaped apertures 118 with a width comprising dimension $d_2$ of about 88 $\mu m$ and that are spaced apart from an edge of an opening 112 in the SMD material 110 over a contact pad 114 by a range of about 40 to 150 $\mu m$ is shown at 142b. A significant reduction in strain was found for all measurements by the implementation of the novel SRSs 116.

Figure 12:
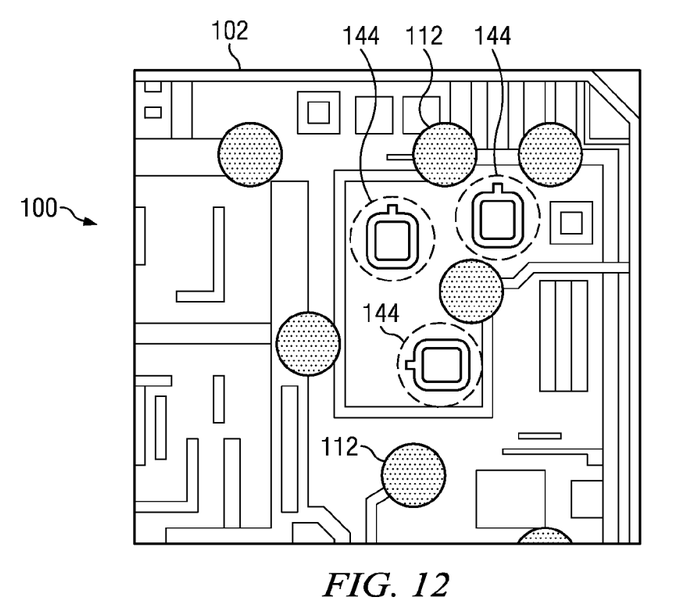
FIG. 12 illustrates a top view of a packaging substrate including inductors in a wiring layer in which the novel SRSs can be implemented in accordance with an embodiment.

FIG. 12 illustrates a top view of a packaging substrate 100 including regions having inductors 144 in the wiring layer (e.g., the wiring layer the contact pads 114a are formed in; see FIG. 3) that the novel SRSs 116 can be implemented in. In some prior art applications, dummy conductive bumps are formed in regions of a substrate 100 having a high amount of stress to provide stress relief, such as in the corner regions 104. This approach requires adding dummy contact pads in the layout for the RDL 122a (see FIG. 3). However, the presence of the inductors 144 in the upper-most conductive layer precludes the use of such dummy contact pads. Advantageously, the novel SRSs 116 described herein may be implemented in inductor 144 regions to relieve stress and strain. The SRSs 116 advantageously are non-conductive and can be also included in the SMD material 110 over portions of other types of circuits or conductive lines in the insulating material 128a and provide effective stress relief, for example.

Figure 13:
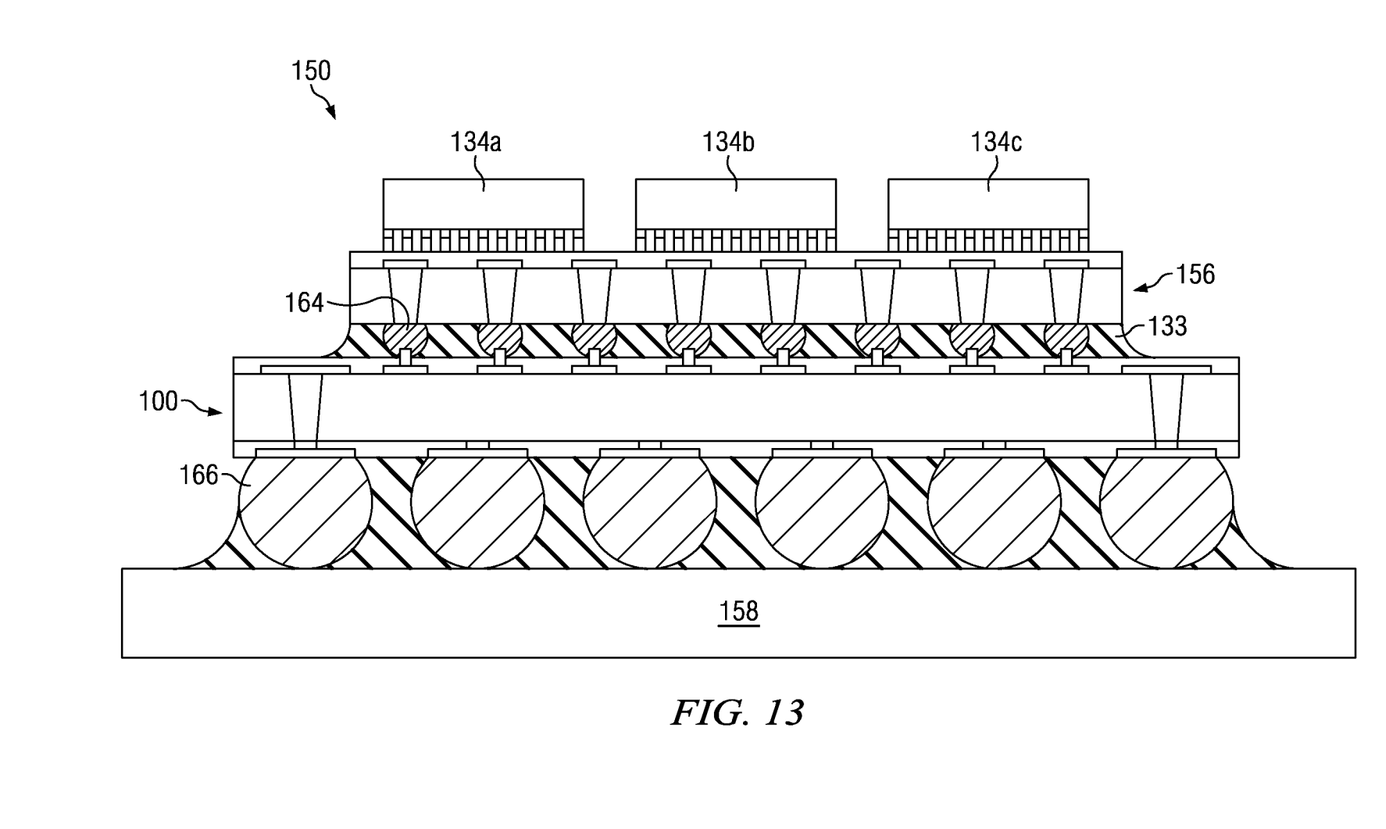
FIGS. 13, 14, and 15 are cross-sectional views of packaged semiconductor devices in which the novel packaging substrates including the SRSs can be implemented in accordance with embodiments.
Figure 14:
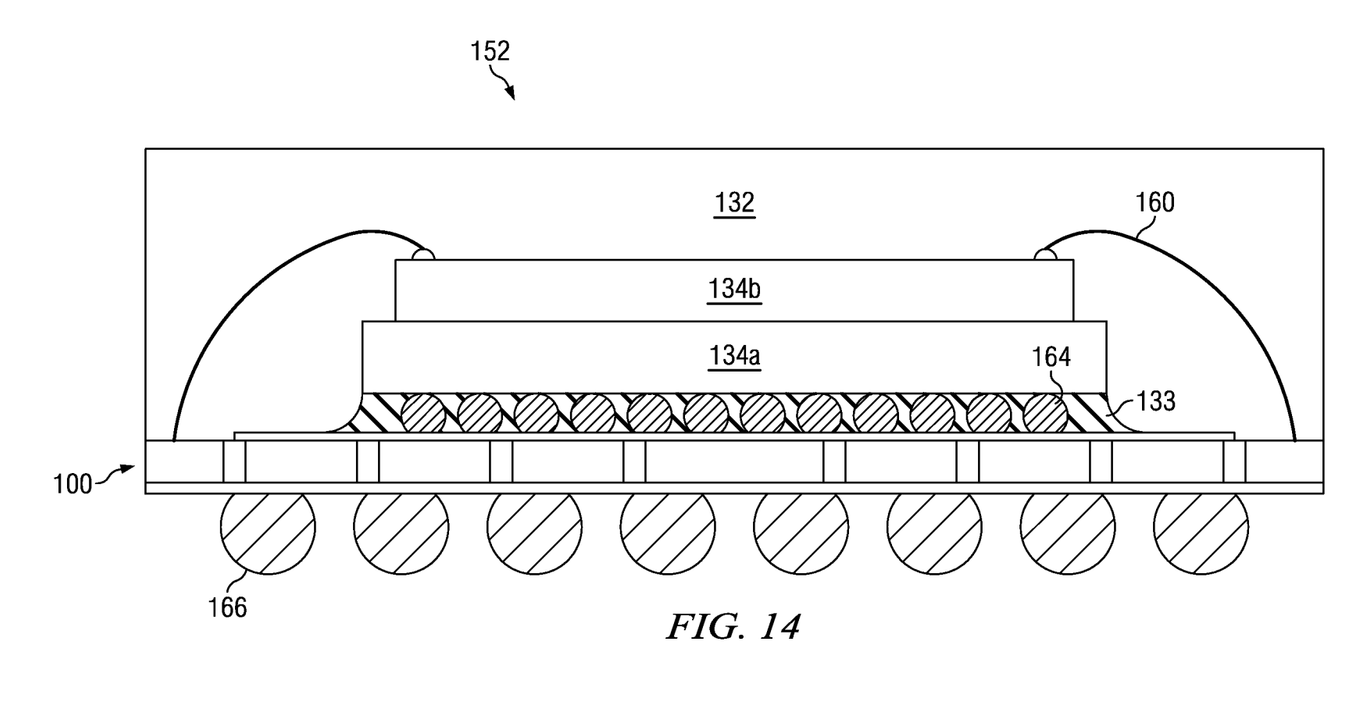
Figure 15:
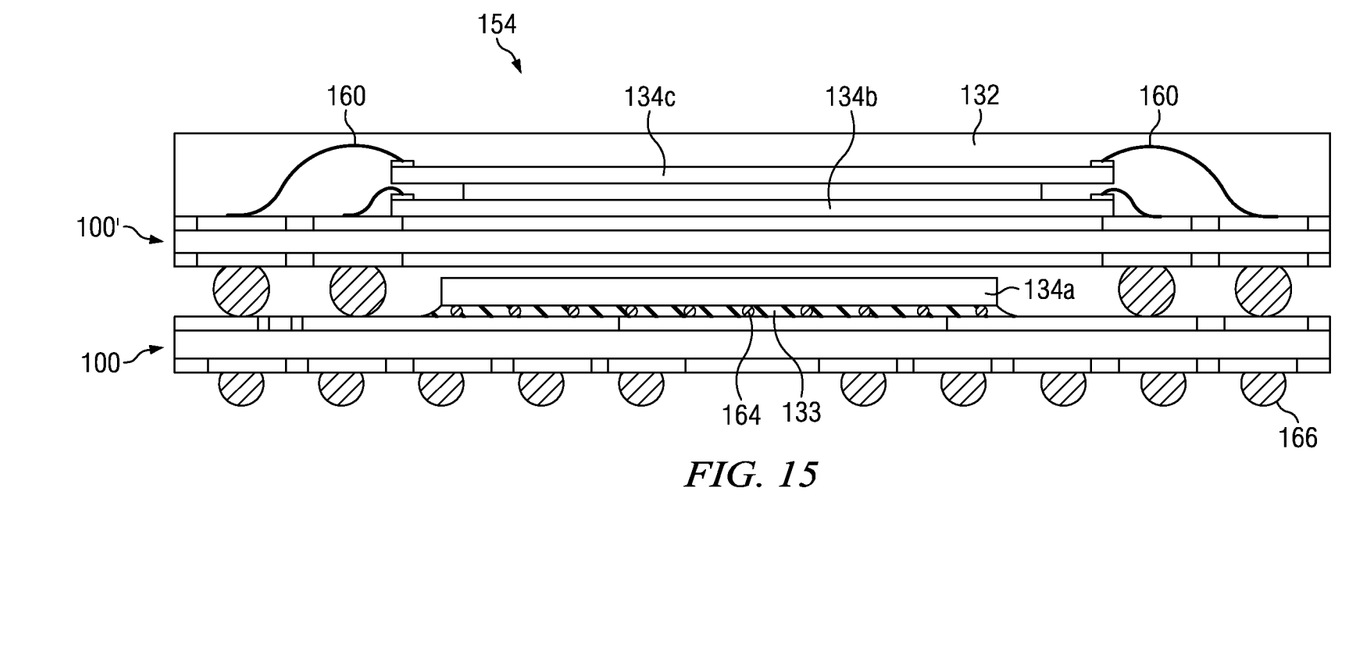

FIGS. 13, 14, and 15 are cross-sectional views of packaged semiconductor devices 150, 152, and 154, respectively, in which the novel packaging substrates 100 including the SRSs 116 can be implemented in accordance with embodiments. Package 150 shown in FIG. 13 comprises a 2.5D package 150 wherein two or more integrated circuit dies 134a, 134b, and 134c are mounted on a silicon interposer 156. The interposer 156 is then mounted on a substrate 100 described herein that includes the SRSs 116 described herein. An underfill material 133 is disposed between the interposer 156 and the substrate 100. The substrate 100 is coupled to a printed circuit board (PCB) 158 by a plurality of solder balls 166 disposed on the bottom of the substrate 100. An underfill material is also disposed between the substrate 100 and the PCB 158. Alternatively, the 2.5D package 150 may comprise other designs and configurations.

FIG. 14 illustrates a package 152 comprising a 3DIC package 152 implementing the novel substrates 100 described herein. The 3DIC package 152 comprises a die on die stacking structure. One die 134b is coupled to a top surface of another die 134a, e.g., by an adhesive. The bottom die 134a is coupled to a substrate 100 including the SRS 116 described herein by a plurality of conductive bumps 164. An underfill material 133 is disposed between the bottom die 134a and the substrate 100. The top die 134b is electrically coupled to the substrate 100 by a plurality of wire bonds 160. A molding compound 132 is formed over the top die 134b, the wire bonds 160, and exposed portions of the substrate 100. Alternatively, the 3DIC package 152 may comprise other designs and configurations.

FIG. 15 illustrates a package 154 comprising a 3DIC package 154 implementing a novel substrate 100 described herein. The 3DIC package 154 comprises a package on package (PoP) structure. Integrated circuit die 134a is coupled to a substrate 100 including the SRS 116 by a plurality of conductive bumps 164. An underfill material 133 is disposed between the die 134a and the substrate 100. Die 134c is coupled to a top surface of die 134b, and both dies 134b and 134c are coupled to a substrate 100' by a plurality of wire bonds 160. A molding compound 132 is formed over the top die 134b, the wire bonds 160, and exposed portions of the substrate 100'. Alternatively, the 3DIC package 154 may comprise other designs and configurations.

Figure 16:
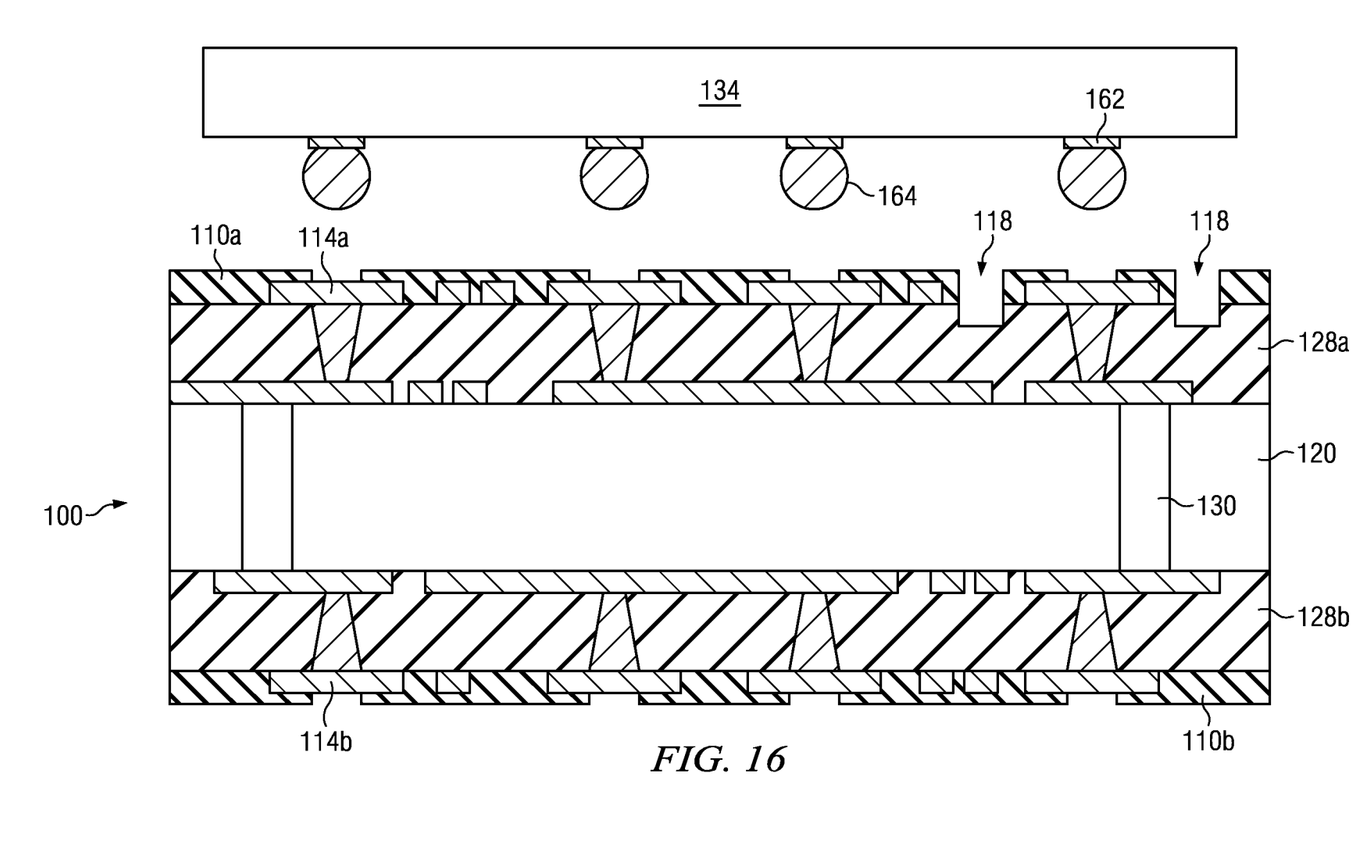
FIG. 16 is a cross-sectional view illustrating an integrated circuit die being attached to a substrate including the SRS in accordance with an embodiment.

FIG. 16 is a cross-sectional view illustrating an integrated circuit die 134 being attached to a substrate 100 including the SRS 116 in accordance with an embodiment. Conductive bumps 164 are coupled to bond pads 162 on the integrated circuit die 134. The conductive bumps 164 may comprise solder or other eutectic material. The conductive bumps 164 are attached to contact pads 114a on the substrate 110, and a solder or other material of the conductive bumps 164 is reflowed, electrically and mechanically coupling the conductive bumps 164 to the contact pads 114a on the substrate 100. Each of the conductive bumps 164 is coupled to one of the contact pads 114a.

Figure 17:
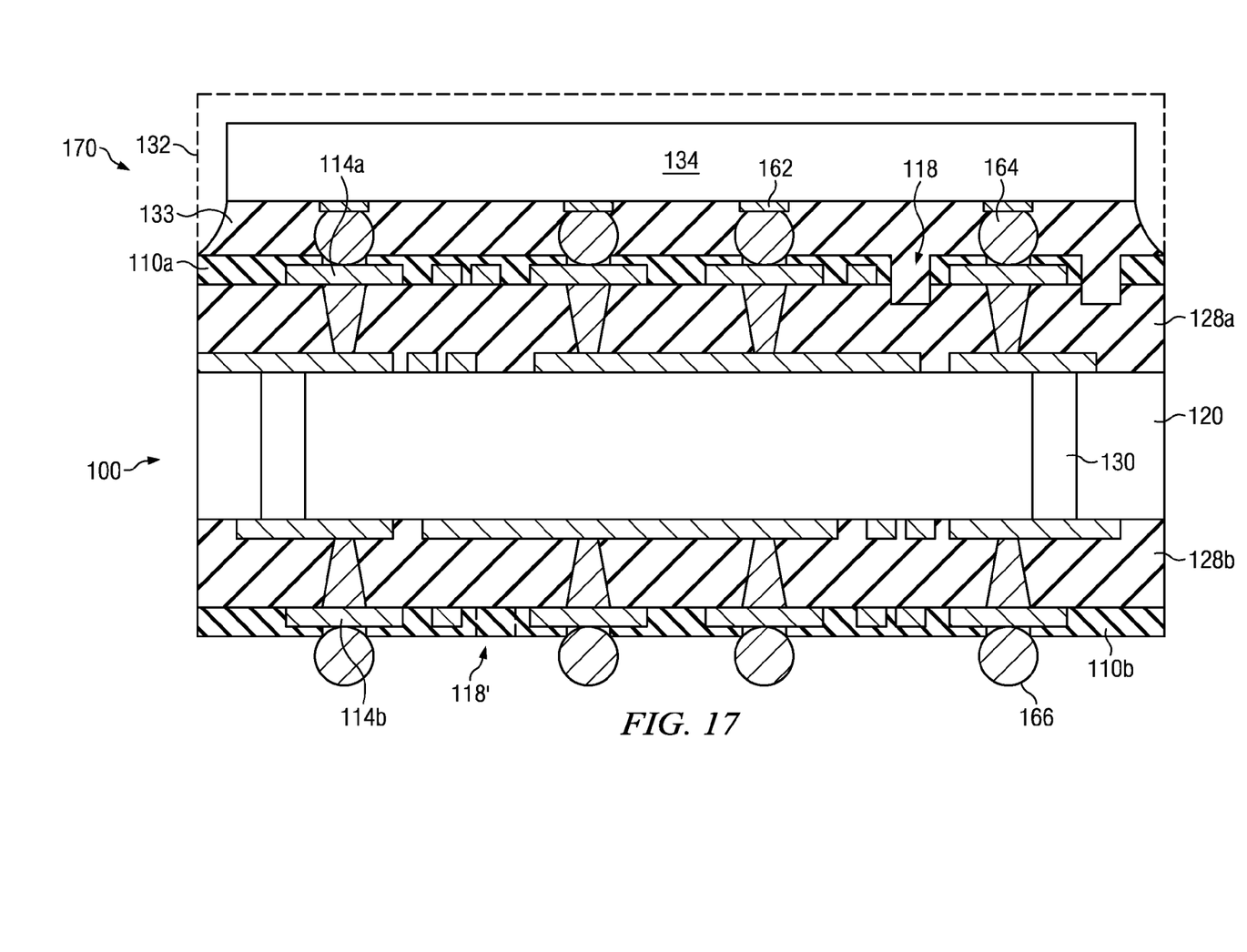
FIG. 17 is a cross-sectional view of a packaged semiconductor device in accordance with an embodiment.

FIG. 17 is a cross-sectional view of a packaged semiconductor device 170 in accordance with an embodiment, after the packaging step shown in FIG. 16. An underfill material 133 is applied between the integrated circuit die 134 and the substrate 100 between the conductive bumps 164. A molding compound 132, shown in phantom in FIG. 17, may be applied over the integrated circuit die 134 and exposed portions of the substrate 100. A plurality of solder balls 166 may be formed on the contact pads 114b on the bottom surface of the substrate 100.

The substrate 100 comprises a flip chip package 170 substrate in accordance with an embodiment, for example. The substrate or package 100 comprises a flip chip chip scale package (FCCSP) in some embodiments. The die 134 may comprise dimensions of about 5.84×4.36 mm in a top view, and the package 100 may comprise dimensions of about 6.5×6.5 mm in the top view, as one example. The number of conductive bumps 164 may comprise about 293, and the global density of the conductive bumps 164 may comprise about 7.4% in an embodiment. The contact pads 114a may comprise an under-ball metallization (UBM) structure having a size of about 88 μm in an embodiment. Alternatively, the package 100, die 134, and UBM may comprise other sizes and may include other numbers and densities of conductive bumps 164.

In some embodiments, the apertures 118 of the SRS 116 are formed in the SMD material 110a and also in a top portion of the insulating material 128a, as shown in FIGS. 16 and 17. When the underfill material 133 is applied between the die 134 and the substrate 100, the underfill material 133 substantially fills the apertures 118 of the SRS 116 in some embodiments. Alternatively, the underfill material 133 may partially fill the apertures 118, or the underfill material 133 may not fill the apertures 118, in other embodiments.

In some embodiments, the SRS 116 formed in the first SMD 110a comprises a first SRS 116, and a second SRS 116' is formed in the second SMD 110b on the opposite side of the substrate 100, as shown in phantom in FIG. 17. The apertures 118' of the second SRS 116' may comprise the same pattern or a different pattern as the apertures 118 of the first SRS 116, for example.

Figure 18:
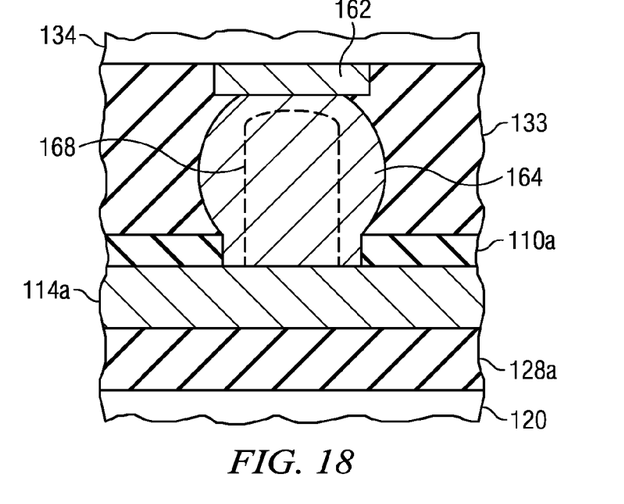
FIG. 18 is a more detailed view of a conductive bump attached to a contact pad of the substrate shown in FIG. 17 in accordance with an embodiment.

FIG. 18 is a more detailed view of a solder bump 164 attached to a contact pad 114a of the substrate 100 shown in FIG. 17 in accordance with an embodiment. The SMD material 110a is used to define an area where the solder bump 164 contacts the contact pad 114a. The solder bump 164 may include a metal pillar 168 in some embodiments. The metal pillar 168 comprises copper or other metal, for example.

The integrated circuit die 134 may comprise a coefficient of thermal expansion (CTE) of about 2.8 ppm/° C., and the underfill material 133 may comprise a CTE of about 11 ppm/° C. The SMD material 110 may comprise a CTE of about 40 ppm/° C., and the substrate core 120 may comprise a CTE of about 10 ppm/° C. The CTEs of the various components of the substrate 100 may alternatively comprise other values. The differences in the CTEs of the various material layers of the packaged semiconductor device 170 are advantageously controlled by the use of the novel SRSs 116 and 116' described herein.

Figure 19:
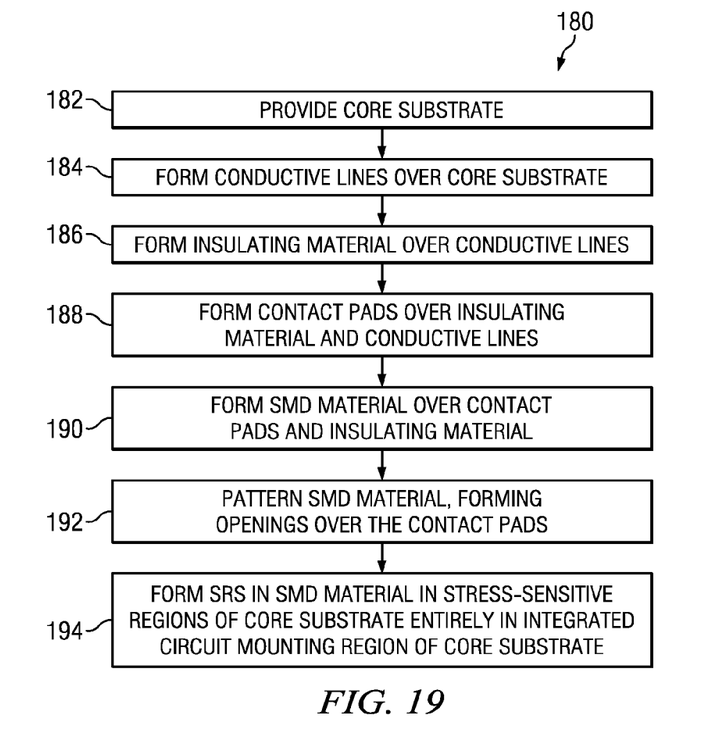
FIG. 19 is a flow chart illustrating a method of manufacturing a substrate for packaging a semiconductor device in accordance with an embodiment.

FIG. 19 is a flow chart 180 illustrating a method of manufacturing a substrate 100 for packaging a semiconductor device in accordance with an embodiment. In step 182, a core substrate 120 is provided. In step 124, conductive lines 124a are formed over the core substrate 120. In step 186, an insulating material 128a is formed over the conductive lines 124a. In step 188, contact pads 114a are formed over the insulating material 128a and the conductive lines 124a. In step 190, an SMD material 110a is formed over the contact pads 114a and the insulating material 128a. In step 192, the SMD material 110a is patterned, forming openings over the contact pads 114a. In step 194, the SRS 116 is formed in the SMD material 110a in stress-sensitive regions of the core substrate 120 entirely in the integrated circuit mounting region 102 of the core substrate 120.

The SRS 116 is formed using a lithography process in some embodiments, by forming a layer of photoresist over the SMD material 110, patterning the layer of photoresist by exposing the layer of photoresist to energy reflected from or pass through a lithography mask, and developing the layer of photoresist. Portions of the layer of photoresist are ashed or etched away, and the patterned layer of photoresist is used as an etch mask while portions of the SMD material 110 are etched away. Alternatively, the SRS 116 may be formed in the SMD material 110 using a direct patterning process, i.e., using laser drilling. The apertures 118 of the SRS 116 may be forming in the SMD material 110 using other methods.

In some embodiments, steps 192 and 194 of the flow chart 180 shown in FIG. 19 may be formed simultaneously using a single lithography process. The patterns for the apertures 118 of the SRS 116 may be included in a lithography mask used to pattern the SMD material 110 for the openings 112 over the contact pads 114. Thus, advantageously, no additional lithography masks or lithography processes are required to implement the novel SRSs 116 described herein, in some embodiments.

In the embodiments shown herein, the SMD material 110*a* is left remaining in the packaged semiconductor device 170. Alternatively, the SMD material 110*a* may be removed before the substrate 100 is used to package an integrated circuit die 134, not shown in the drawings.

Embodiments of the present disclosure include methods of manufacturing substrates 100 for packaging semiconductor devices, and also include substrates 100 for packaging semiconductor devices and packages 100 for semiconductor devices that include the novel SRSs 116 described herein. Embodiments of the present disclosure also include packaged semiconductor devices 170 that have been packaged using the novel packaging substrates and packages 100 described herein.

Advantages of embodiments of the disclosure include providing novel SRSs 116 that provide stress and strain relief for semiconductor device packages. Substrate 100 structures for flip chip packaging are provided that improve chip-to-package interaction (CPI) integrity in semiconductor devices. The package 100 designs reduce the possibly of conductive bump 124 cracks forming in solder joints by including the novel SRSs 116 in the SMD material 110.

The SMD material 110 defines openings 112 for the contact pads 114, which reduces chances or bridging and contact pad 114 lifting and is suitable for fine pitch input/output (I/O). Conductive bump 164 integrity is improved effectively using the novel SRSs 116 by reducing strain values in stress-sensitive regions. Conductive bump 164 strain is reduced by about 10% or greater in accordance with some embodiments, for example.

Including the SRSs 116 in the SMD material 110 results in a decrease of CTE mismatch between the underfill material 133, integrated circuit die 134, core substrate 120, and SMD material 110, resulting in improved bump integrity. The SRSs 116 and 116' may be included on one side or on both sides of the substrate 100 to decrease CTE mismatch and provide stress and strain relief for the packaged semiconductor device 170.

The SRSs 116 described herein can be included in packaging designs that utilize a solder mask define (SMD) mounting pad design. The SRSs 116 are particularly suitable for integrated circuit dies 134 having non-uniform conductive bump 164 maps in some applications, for example. The novel SRS 116 designs are easily implementable in packaging manufacturing process flows.

In accordance with one embodiment of the present disclosure, a substrate for packaging a semiconductor device includes a core substrate, an insulating material disposed over the core substrate, and a plurality of conductive lines disposed in the insulating material. A plurality of contact pads is disposed over the insulating material and the plurality of conductive lines. The plurality of contact pads is disposed in an integrated circuit mounting region of the core substrate. An SMD material is disposed over the insulating material. Portions of the plurality of contact pads are exposed through openings in the SMD material. An SRS is disposed in the SMD material proximate the plurality of contact pads. The SRS is disposed entirely in the integrated circuit mounting region of the core substrate.

In accordance with another embodiment, a package for a semiconductor device includes a core substrate having a top surface and a bottom surface. A first RDL is disposed over the top surface of the core substrate, and a first insulating material is disposed over the first RDL. A plurality of first contact pads is disposed over the first insulating material in an integrated circuit mounting region of the top surface of the core substrate. A first SMD material is disposed over the first insulating material and the plurality of first contact pads, wherein portions of the plurality of first contact pads are exposed through first openings in the first SMD material. A plurality of apertures is disposed in the first SMD material proximate the first openings in the first SMD material over plurality of first contact pads in corners of the package. The plurality of apertures is disposed entirely in the integrated circuit mounting region of the core substrate. The package includes a second RDL disposed over the bottom surface of the core substrate. A second insulating material is disposed over the second RDL, and a plurality of second contact pads is disposed over the second insulating material. A second SMD material is disposed over the second insulating material and the plurality of second contact pads. Portions of the plurality of second contact pads are exposed through second openings in the second SMD material.

In accordance with yet another embodiment, a method of manufacturing a substrate for packaging a semiconductor device includes providing a core substrate, forming a plurality of conductive lines over the core substrate, and forming an insulating material over the plurality of conductive lines. A plurality of contact pads is formed over the insulating material and the plurality of conductive lines in an integrated circuit mounting region of the core substrate. An SMD material is formed over the plurality of contact pads and the insulating material, and the SMD material is patterned to form openings over the plurality of contact pads. The method includes forming an SRS in the SMD material in stress-sensitive regions of the core substrate entirely in the integrated circuit mounting region of the core substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A substrate for packaging a semiconductor device, the substrate comprising:
a core substrate;
an insulating material disposed over the core substrate;

a plurality of conductive lines disposed in the insulating material;
a plurality of contact pads disposed over the insulating material and the plurality of conductive lines, the plurality of contact pads being disposed in an integrated circuit mounting region of the core substrate, wherein the semiconductor device will cover the integrated circuit mounting region, and wherein a width of the semiconductor device is no smaller than a width of the integrated circuit mounting region;
a solder mask define (SMD) material disposed over the insulating material, wherein portions of the plurality of contact pads are exposed through openings in the SMD material; and
a stress-relief structure (SRS) disposed in the SMD material proximate the plurality of contact pads, wherein the SRS is disposed entirely in the integrated circuit mounting region of the core substrate.

2. The substrate according to claim 1, wherein the SRS is disposed in corner regions of the integrated circuit mounting region of the core substrate.

3. The substrate according to claim 1, wherein the SRS is disposed in edge regions of the integrated circuit mounting region of the core substrate.

4. The substrate according to claim 1, wherein the SRS comprises a plurality of apertures in the SMD material.

5. The substrate according to claim 4, wherein each of the plurality of apertures of the SRS comprises a shape selected from the group consisting essentially of a circle, an oval, a square, a donut, an asymmetric shape, and combinations thereof.

6. The substrate according to claim 5, wherein one of the plurality of apertures of the SRS comprises a donut shape and is disposed around an opening in the SMD material over one of the plurality of contact pads.

7. The substrate according to claim 4, wherein each of the plurality of apertures of the SRS is spaced apart from an opening in the SMD material over one of the plurality of contact pads by about 3 to 300µm.

8. A package for a semiconductor device, comprising:
a core substrate having a top surface and a bottom surface;
a first redistribution layer (RDL) disposed over the top surface of the core substrate;
a first insulating material disposed over the first RDL;
a plurality of first contact pads disposed over the first insulating material in an integrated circuit mounting region of the top surface of the core substrate, wherein the integrated circuit mounting region is an area of the core substrate that will be entirely covered by the semiconductor device;
a first solder mask define (SMD) material disposed over the first insulating material and the plurality of first contact pads, wherein portions of the plurality of first contact pads are exposed through first openings in the first SMD material;
a plurality of apertures disposed in the first SMD material proximate the first openings in the first SMD material over the plurality of first contact pads in corners of the package, the plurality of apertures being disposed entirely in the integrated circuit mounting region of the core substrate;
a second RDL disposed over the bottom surface of the core substrate;
a second insulating material disposed over the second RDL;
a plurality of second contact pads disposed over the second insulating material; and
a second SMD material disposed over the second insulating material and the plurality of second contact pads, wherein portions of the plurality of second contact pads are exposed through second openings in the second SMD material.

9. The package according to claim 8, wherein the plurality of apertures is further disposed in a top portion of the first insulating material.

10. The package according to claim 8, wherein each of the plurality of apertures comprises a width of about 200µm or less.

11. The package according to claim 8, wherein the core substrate includes a plurality of through-substrate vias (TSVs) disposed therein, and wherein the TSVs couple together portions of the first RDL and the second RDL.

12. The package according to claim 8, wherein the plurality of apertures comprises a plurality of first apertures, further comprising a plurality of second apertures in the second SMD material proximate the second openings in the second SMD material over plurality of second contact pads in corners of the package, the plurality of second apertures being disposed entirely in the integrated circuit mounting region of the core substrate.

13. The package according to claim 8, wherein the package comprises a flip chip package.

14. A packaged semiconductor device, comprising:
the package according to claim 8; and
an integrated circuit die coupled to the package in the integrated circuit mounting region by a plurality of conductive bumps, wherein each of the plurality of conductive bumps is coupled to one of the plurality of first contact pads.

15. The packaged semiconductor device according to claim 14, further comprising an underfill material disposed between the package and the integrated circuit die, wherein the underfill material substantially fills the plurality of apertures.

16. A method of manufacturing a substrate for packaging a semiconductor device, the method comprising:
providing a core substrate;
forming a plurality of conductive lines over the core substrate;
forming an insulating material over the plurality of conductive lines;
forming a plurality of contact pads over the insulating material and the plurality of conductive lines in an integrated circuit mounting region of the core substrate, wherein the integrated circuit mounting region defines an outer perimeter of the semiconductor device that is subsequently attached to the core substrate;
forming a solder mask define (SMD) material over the plurality of contact pads and the insulating material;
patterning the SMD material to form openings over the plurality of contact pads; and
forming a stress-relief structure (SRS) in the SMD material in stress-sensitive regions of the core substrate entirely in the integrated circuit mounting region of the core substrate.

17. The method according to claim 16, wherein forming the SRS comprises patterning the SMD material to form an aperture between two of the openings in the SMD material over the plurality of contact pads.

18. The method according to claim 16, wherein forming the SRS comprises patterning the SMD material to form a plurality of apertures, and wherein patterning the SMD material to form the openings over the plurality of contact pads and forming the SRS in the SMD material are performed simultaneously using a single lithography process.

19. The method according to claim 16, wherein forming the SRS comprises patterning the SMD material to form a plurality of apertures, and wherein forming the SRS in the SMD material comprises a lithography process or a direct patterning process.

20. The method according to claim 16, wherein forming the SRS comprises patterning the SMD material to form a plurality of apertures, and wherein each of the plurality of apertures comprises a width that is less than a width of the openings in the SMD material over the plurality of contact pads.

* * * * *